United States Patent [19]

Moroo et al.

[11] Patent Number: 6,032,222

[45] Date of Patent: *Feb. 29, 2000

[54] SEMICONDUCTOR MEMORY DEVICE WITH SIMULTANEOUSLY WRITE CAPABILITY

[75] Inventors: Chisa Moroo; Moemi Fujio, both of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/805,229

[22] Filed: Feb. 24, 1997

[30] Foreign Application Priority Data

Feb. 28, 1996 [JP] Japan ..................................... 8-041141

[51] Int. Cl.[7] .............................. G06F 13/00; G11C 7/00
[52] U.S. Cl. ......................... 711/104; 711/111; 711/154; 365/189.05; 365/230.01; 365/230.03
[58] Field of Search ..................................... 711/100, 104, 711/105, 111, 154, 156; 365/189.05, 230.01, 230.03

[56] References Cited

U.S. PATENT DOCUMENTS

| | | | |
|---|---|---|---|
| 5,065,365 | 11/1991 | Hirayama | 365/189.05 |
| 5,134,589 | 7/1992 | Hamano | 365/238.5 |
| 5,293,347 | 3/1994 | Ogawa | 365/230.01 |
| 5,305,278 | 4/1994 | Inone | 365/230.03 |
| 5,315,560 | 5/1994 | Nishimoto et al. | 365/238.5 |
| 5,325,325 | 6/1994 | Azuma | 365/156 |
| 5,369,611 | 11/1994 | Miura | 365/189.05 |
| 5,402,381 | 3/1995 | Sonobe et al. | 365/218 |
| 5,475,647 | 12/1995 | Yim | 365/230.03 |
| 5,508,960 | 4/1996 | Pinkham | 365/189.01 |
| 5,579,506 | 11/1996 | Ogawa | 711/156 |
| 5,621,691 | 4/1997 | Park | 365/200 |

FOREIGN PATENT DOCUMENTS 4-216392 8/1992 Japan .
5-12860 1/1993 Japan .

*Primary Examiner*—Tod R. Swann
*Assistant Examiner*—Tuan V. Thai
*Attorney, Agent, or Firm*—Foley & Lardner

[57] ABSTRACT

The present invention provides a semiconductor memory device having a block write function to perform an image processing at a high speed for any region on an image plane. The semiconductor memory device comprises a column decoder circuit 1; a column address latch circuit 2; a write control circuit 3 including NMOS transistors 13; a column mask register 4 including registers 10; a color register 5 including registers 11n; a Y switch 6 including switches 14; a memory cell 7; a block write control circuit 8; a column mask control circuit 9 including NOR gates 12; a column address pre-decode circuit 15 corresponding to subordinate column addresses Y0, Y1 and Y2; and a column address pre-decode circuit 16 corresponding to superordinate column addresses Y3, Y4 and Y5.

6 Claims, 5 Drawing Sheets

FIG. 6
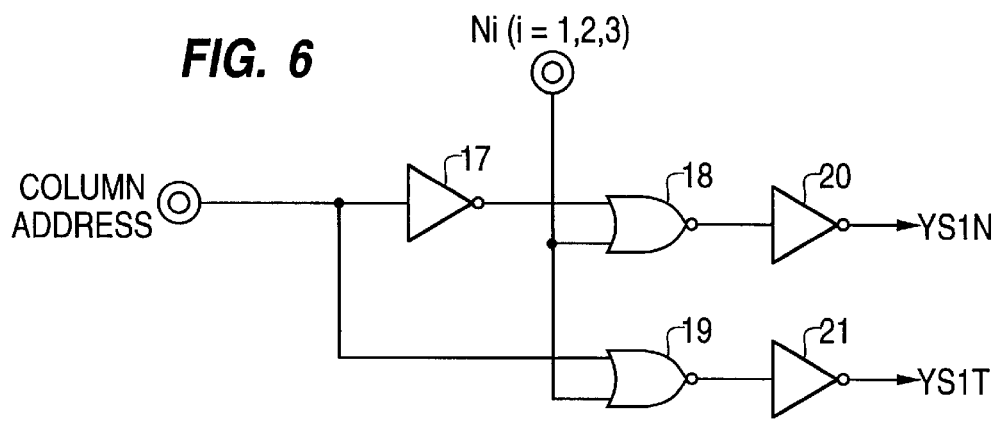
FIG. 7
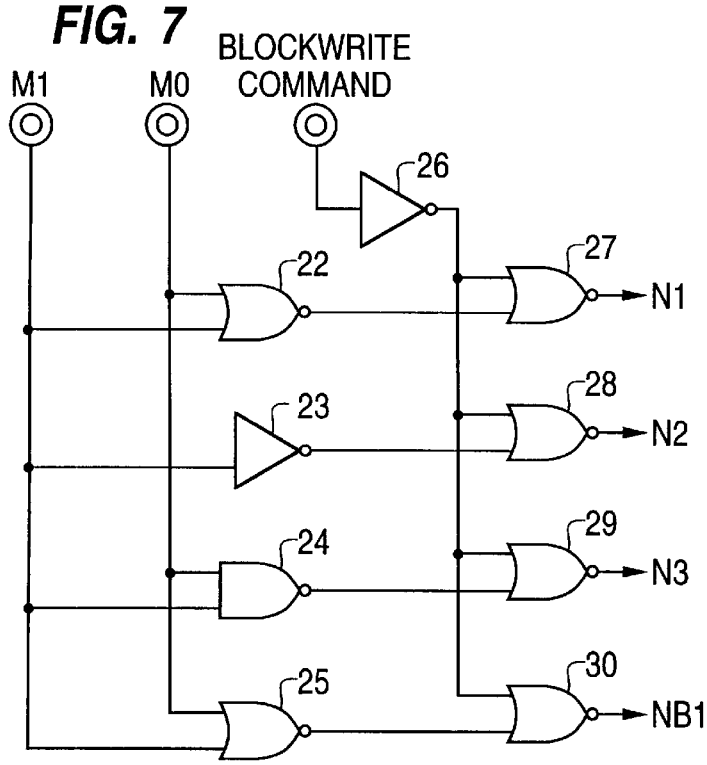
FIG. 8
| INPUT SIGNAL | | SELECTED BLOCK NO. (COLUMNS) | OUTPUT SIGNAL | | |
|---|---|---|---|---|---|
| M1 | M0 | | N3 | N2 | N1 |
| 0 | 0 | PRIOR BLOCK WRITE (8) | 0 | 0 | 0 |
| 0 | 1 | 2 BLOCKS (16) | 0 | 0 | 1 |
| 1 | 0 | 4 BLOCKS (32) | 0 | 1 | 1 |
| 1 | 1 | 8 BLOCKS (64) | 1 | 1 | 1 |

SEMICONDUCTOR MEMORY DEVICE WITH SIMULTANEOUSLY WRITE CAPABILITY

BACKGROUND OF THE INVENTION

1. Background of the Invention

The present invention relates to a semiconductor memory device, more particularly to a semiconductor memory device which has a function to write selectively specified data simultaneously to memory cells corresponding to a block composed of a plurality of columns.

2. Description of the Related Art

A processing function called a block write has heretofore been utilized as a method for performing an image processing at any region on a display screen at a high speed. This processing function called the block write is the one to control writing operation for the specified data to the blocks, each block being composed of a plurality of columns, at a certain write cycle of the semiconductor memory device. Usually, I/O data supplied in a specified block cycle is not used as writing data in this block cycle, but data which has been previously supplied to be stored in a register called a color register is used.

Furthermore in a block write cycle, there is a function called a column mask function. This function called column mask function is the one, for each column of a plurality of columns, to control the writing operation to memories corresponding to I/O terminals masked by data for every column. The control is made in the following manner. For example, when data at the I/O terminal is at high level, the data is written to the column corresponding to this I/O terminal. When the data at the I/O terminal is at low level, the data is not written to the column corresponding thereto. In this column mask function, there are two methods. One is a method to use I/O data supplied at the block write as the data at the I/O terminal corresponding to each column for write controlling: the other is a method to use the I/O data held in registers called a column mask register which previously has been held the I/O data. In any of these methods, the number of the columns to which the data is simultaneously written must be less than the number of the I/O terminals.

Next, a conventional semiconductor memory device to realize the above-described writing function will be described with reference to drawings. FIG. 1 is a block diagram showing an example of a conventional semiconductor memory device which has eight I/O terminals 38 and 39 for one block, the number of columns of one column to which data is simultaneously written being eight. As shown in FIG. 1, this conventional semiconductor memory device comprises, corresponding to the I/O terminals 38 and 39, a column decode circuit 1, a column address latching circuit 2, a writing control circuit 3 including eight NMOS transistors 13, a column mask register 4 including eight registers 10, a color register 5 including eight registers 11, a Y-switch 6 including eight switches 14, a memory cells 7, a column address pre-decode circuits 15 corresponding to three subordinate column addresses, and a column address pre-decode circuits 16 corresponding to three superordinate column addresses. It is noted that the circuit corresponding to one I/O terminal of the I/O terminal 39 is illustrated, in FIG. 1, as the circuit including the writing control circuit 3 and the memory cell 7. An example of the constitution of the above-mentioned column address pre-decode circuit 15 is illustrated in FIG. 2. An example of the constitution of the above-described column address pre-decode circuit 16 is also illustrated in FIG. 3.

Referring to FIG. 1, column addresses Y0, Y1, Y3, Y4, and Y5 are supplied to corresponding column address pre-decode circuit via the column address latching circuit 2, Each of the subordinate column addresses Y0, Y1, and Y2 is supplied to corresponding one of the column address pre-decode circuits 15, and each of the superordinate column addresses Y3, Y4, and Y5 is supplied to corresponding one of the column address pre-decode circuits 16.

As shown in FIG. 2, the column address pre-decode circuit 15 consists of inverters 31, 34 and 35, and NOR gates 32 and 33. During a block write cycle, in response to the supply of a block write command signal ("H" level), the foregoing subordinate column addresses are neglected regardless of the supply of the subordinate column addresses. Concerning signals YPOT and YPON output from the inverters 34 and 35, 8 columns (one block) in which the superordinate column addresses Y3, Y4 and Y5 are equal is selected, whereby a "H" level signal is output to be supplied to the column decode circuit 1. As shown in FIG. 3, the column address pre-decode circuit 16 consists of inverters 36, 37 and 38. No block write command signal is supplied to the column address pre-decode circuit 16. Upon receipt of the superordinate column addresses Y3, Y4 and Y5, a signal at a selected level is provided to either an output terminal YPIN or an output terminal YPIT and is supplied to the column decode circuit 1.

The column address, which is provided from the column address predecode circuit 15 and 16 to supply to the column decode circuit 1, is decoded by the column decode circuit 1. Then, the column address signal at "H" level after being decoded is output therefrom as a decoded signal and supplied to the Y switch 6. Upon receipt of the decoded signal at "H" level as an input, all of the switch circuits 14 of the Y switch 6 are turned on, and corresponding to 8 column adrresses, digit lines D0, D1, D2, D3, D4, D5, D6 and D7 connected to the memory cells 7 are simultaneously selected. Specifically, in the conventional memory device, during the block write cycle, the block write command signal is supplied from the outside, and the same 8 column digit lines depending on the superordinate column addresses Y3, Y4 and Y5 are selected regardless of values of data of the column address Y0, Y1 and Y2 which are the subordinate three bits.

Furthermore, as shown in FIG. 1, the writing control operation for each of the eight columns selected in such manner is performed either by the I/O data supplied from the 8 I/O terminals 38 at the block write cycle or by the input data c0 to c7 stored in the registers 10 inside the column mask register 4, which are previously supplied from the I/O terminal 38, before the block write cycle. These data are supplied to the gates of the NMOS transistors 13 constituting the write control circuit 3. When these data are at "H" level, these NMOS transistors 13 become a turning-on state. Data d0 supplied from the one I/O terminal among the I/O terminals 39 is supplied to the memory cell 7 via the write control circuit 3, the Y switch 6, and the digit lines D1 to D7 and written thereto. Furthermore, when the foregoing data is at "L" level, data writing is not performed. At the time of this data writing control, the column address control operation for the column of the least address number among the eight columns is controlled either by the input data supplied to the I/O terminal 38-0 during the block write cycle or by the data c0 held in the register 10 of the column mask register 4. Thereafter, the control operations are performed sequentially. The column address control operation for the column of the most largest address number among the eight columns is controlled either by input data to the I/O terminal 38-7 supplied at the block write cycle or by data c7 stored in the register 10 of the column mask register 4. As described above, the column address control is controlled by data corresponding to the I/O terminal 38 allotted to the respective column addresses. Moreover, the writing data for these selected 8 columns is written to the memory cell 7 by the following two ways. First, the data supplied to the I/O terminal 39 at the time of the block write cycle is transmitted to the digit lines D0 to D7 via the write control circuit 3 and the Y switch 6 to be written to the memory cell 7. Secondly, the data d0 previously supplied from the I/O terminal 39 to the register 11 of the color register 5 to be stored therein at the time of the block write cycle is transmitted to the digit lines D0 to D7 via the write control circuit 3 and the Y switch 6 to be written to the memory cell 7.

FIG. 4 is a schematic drawing showing an example of a block write method in the case where the eight column form one block and sixty four columns are divided into eight blocks. Moreover, in this method, data writing is performed only for the column of address number 5 to 59 among the columns of address number 0 to 63. When the data writing is usually performed for the columns of address number 5 to 59 using the normal write cycle, the writing operation must be conducted by performing the normal write cycle during the 55 cycles. However, when the data writing operation is conducted using this block write cycle, the columns in the portion R in FIG. 4 are subjected to the column mask and the data writing is finished completely after performing only the block write cycle for eight cycles. Therefore, the block writing will be possible to perform the data writing operation more faster than the normal writing.

In the foregoing semiconductor memory device, the number of columns to which data are simultaneously written is constant at the time of the block write cycle. Also in the case where a certain region on the image plane is processed over a wide range, it is limited to the writing operation corresponding to the number of the columns so that the restriction to the processing capability on the image plane is made. It is impossible to realize a more increase in the processing capability.

SUMMARY OF THE INVENTION

The present invention is to provide a semiconductor memory device which is capable of selecting any block and the number of columns by varying the block and the number of the columns to be simultaneously selected and written with data, thereby performing a high speed image processing for a certain region on an image plane.

The semiconductor memory device of the present invention comprises a plurality of first column address pre-decode means corresponding to subordinate column address inputs controlled by a predetermined block write command signal, at the time of a block write cycle; a plurality of second column address pre-decode means corresponding to superordinate column address inputs for receiving specific enable signals at the time of the block write cycle; column decode means for decoding outputs from the first and second column address pre-decode means to output a decoded output; column mask data holding means connected to a first I/O terminal group, for holding column mask data; color data holding means connected to a second I/O terminal group, for holding color data; write control means controlled either by data supplied from the first I/O terminal group or by data held in the column mask data holding means, said write control means performing a write control for write inputs of either the data supplied from the second I/O terminal group or the data held in the color data holding means; Y switch means, switching of which is controlled by the decoded outputs from the column decode means, the Y switch means controlling connections of data output from the write control means to digit lines; block write control means for receiving one or more specific mode signals at the block write cycle and for generating the specific enable signals and outputting the enable signals to the second column address pre-decode means, the block write control means generating a specific column mask release signal; column mask control means controlled by the column mask release signal, the column mask control means controlling inputting of the column mask data to the write control means; and a plurality of memory cells corresponding to a plurality of columns as one block, wherein the memory device has a block write function to write prescribed data selectively and simultaneously to a memory cell corresponding to the one block; and a control function to perform write/non-write control corresponding to individual column addresses in a block to which data is written simultaneously when the number of blocks is one, to which data is simultaneously written, and a control function to control compulsory simultaneous data writing corresponding to all blocks simultaneously designated when the number of the blocks is more than one, through a control operation by the enable signals and the column mask release signal output from the block write control means.

The block write control means comprises first and second NOR gates, each gate performing a logic-sum operation for first and second mode signals and outputting a result of the logic-sum operation; a first inverter inverting the second mode signal and outputting an inverted signal; a NAND gate performing a logic-product operation for the first and second mode signals and outputting a result of the logic-product operation; a second inverter inverting the block write command signal and outputting an inverted signal; a third NOR gate performing a logic-sum operation for the result of the logic-sum operation and the inverted signal and outputting a result of the logic-sum operation; a fourth NOR gate performing a logic-sum operation for the inverted signal from the inverter and the inverted signal from the second inverter and outputting a result of the logic-sum operation; a fifth NOR gate performing a logic-sum operation for the result of the logic-product operation from the NAND gate and the inverted signal from the second inverter and outputting a result of the logic-sum operation; and a sixth NOR gate performing a logic-sum operation for the result of the logic-sum operation from the second NOR gate and the inverted signal from the second inverter and outputting a result of the logic-sum operation, and wherein the semiconductor memory device has a function to receive the block write command signal and to output first, second and third enable signals as the enable signal and the column mask release signal in response to supplying of a mode signal including first and second mode signals.

The column mask control means may be constituted of a plurality of NOR gates, each performing a logic-sum operation for write input data and the column mask release signal and outputting a result of the logic-sum operation, the write input data being obtained either from data supplied from the first I/O terminals or from data held in the column mask data holding means.

Furthermore, the second column address pre-decode means may be constituted of a first inverter receiving a superordinate column address and inverting the column address to output an inverted address; a first NOR gate performing a logic-sum for the inverted address from the first inverter and an n-th enable signal (n=1, 2 and 3) to output a result of the logic-sum operation; a second NOR gate performing a logic-sum operation for the superordinate column address and the n-th enable signal to output a result of the logic-operation; a second inverter inverting an output level of the result of the logic-sum operation of the first NOR gate to output the inverted result of the logic-sum operation of the first NOR gate; and a third inverter inverting an output level of the result of the logic-sum operation of the second NOR gate to output the inverted result of the logic-sum operation of the second NOR gate. Furthermore, the column mask data holding means may be constituted of a plurality of registers connected to first I/O terminal group, the registers holding data supplied from the first I/O terminal group. Furthermore, the color data holding means may be constituted of a plurality of registers connected to the second I/O terminal group, the registers holding data supplied from the second I/O terminal group.

BRIEF DESCRIPTION OF THE DRAWINGS

For a more complete understanding of the present invention and the advantages thereof, reference is now made to the following description taken in conjunction with the accompanying drawings, in which;

FIG. 6 is a circuit diagram of a column address per-decode circuit corresponding to superordinate column addresses in this embodiment of the semiconductor memory device of the present invention;

FIG. 7 is a circuit diagram showing a block write control circuit in the embodiment of the semiconductor memory device of the present invention;

FIG. 8 is a table showing inputs and outputs in the block write control circuit.

DETAILED DESCRIPTION OF THE PREFERRED EMBODIMENT

An embodiment of the present invention will be described with reference to the accompanying drawings.

Figure 1:
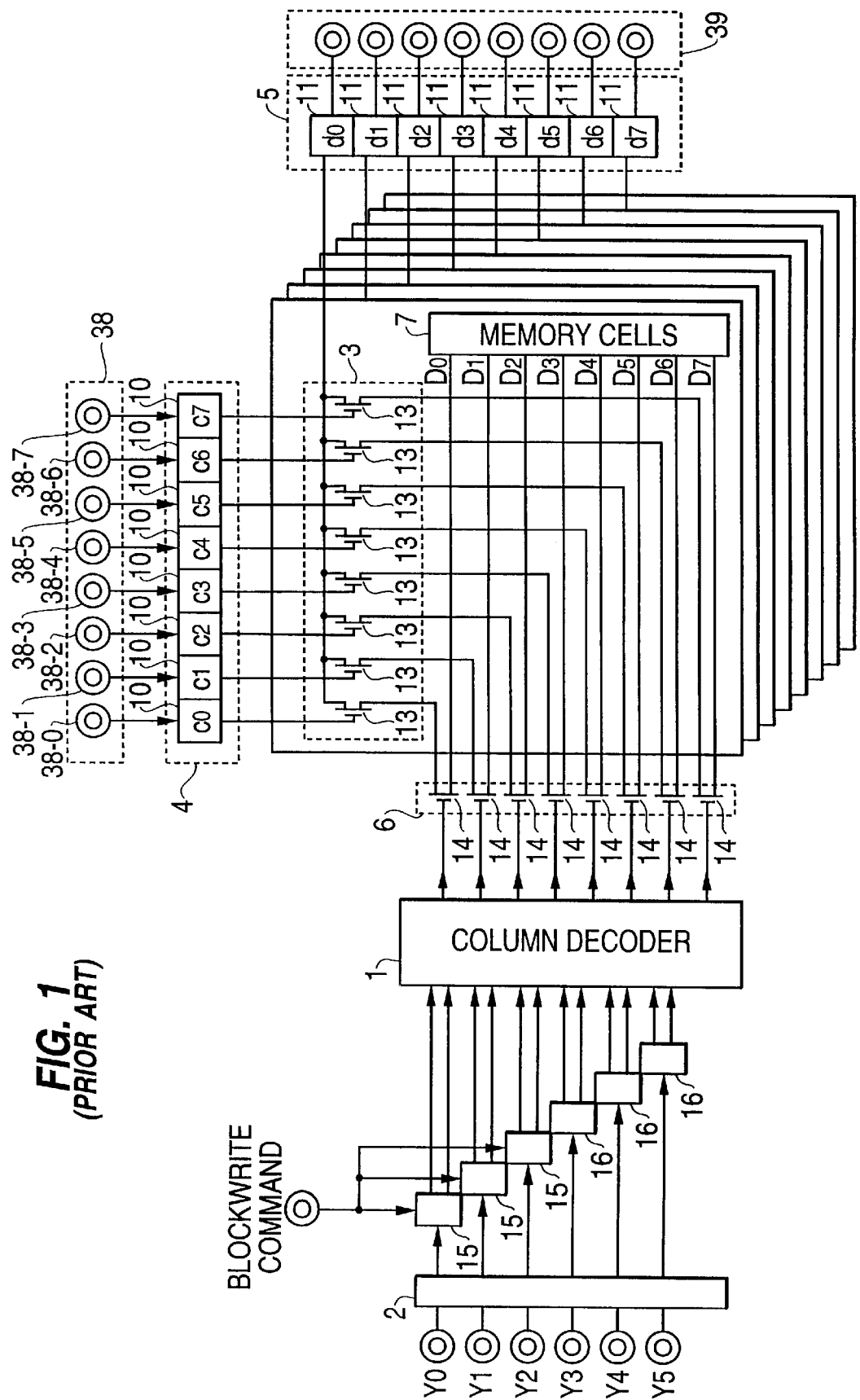
FIG. 1 is a block diagram showing a conventional semiconductor memory device.
Figure 2:
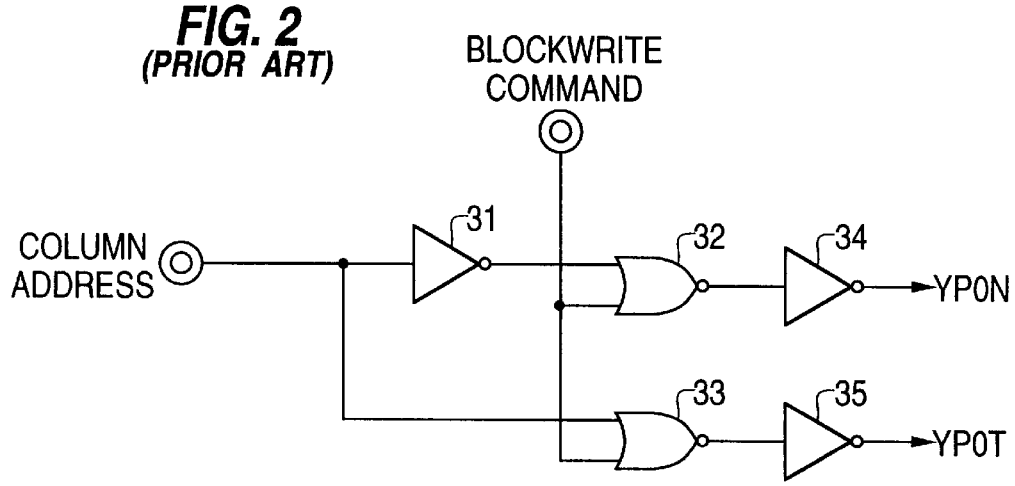
FIG. 2 is a circuit diagram showing a column address pre-decode circuit corresponding to subordinate column addresses in the conventional semiconductor memory device.
Figure 3:
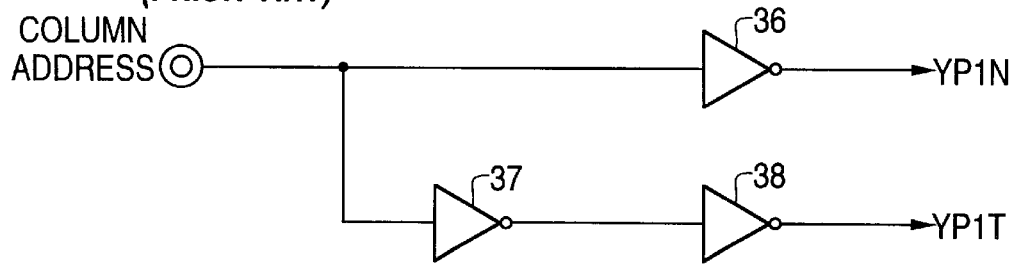
FIG. 3 is a circuit diagram showing a column address pre-decode circuit corresponding to superordinate column addresses in the conventional semiconductor memory device.
Figure 4:
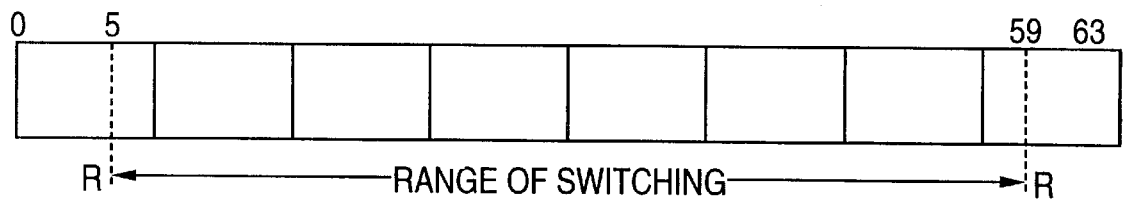
FIG. 4 is a schematic drawing showing a block write method in the conventional semiconductor memory device.
Figure 5:
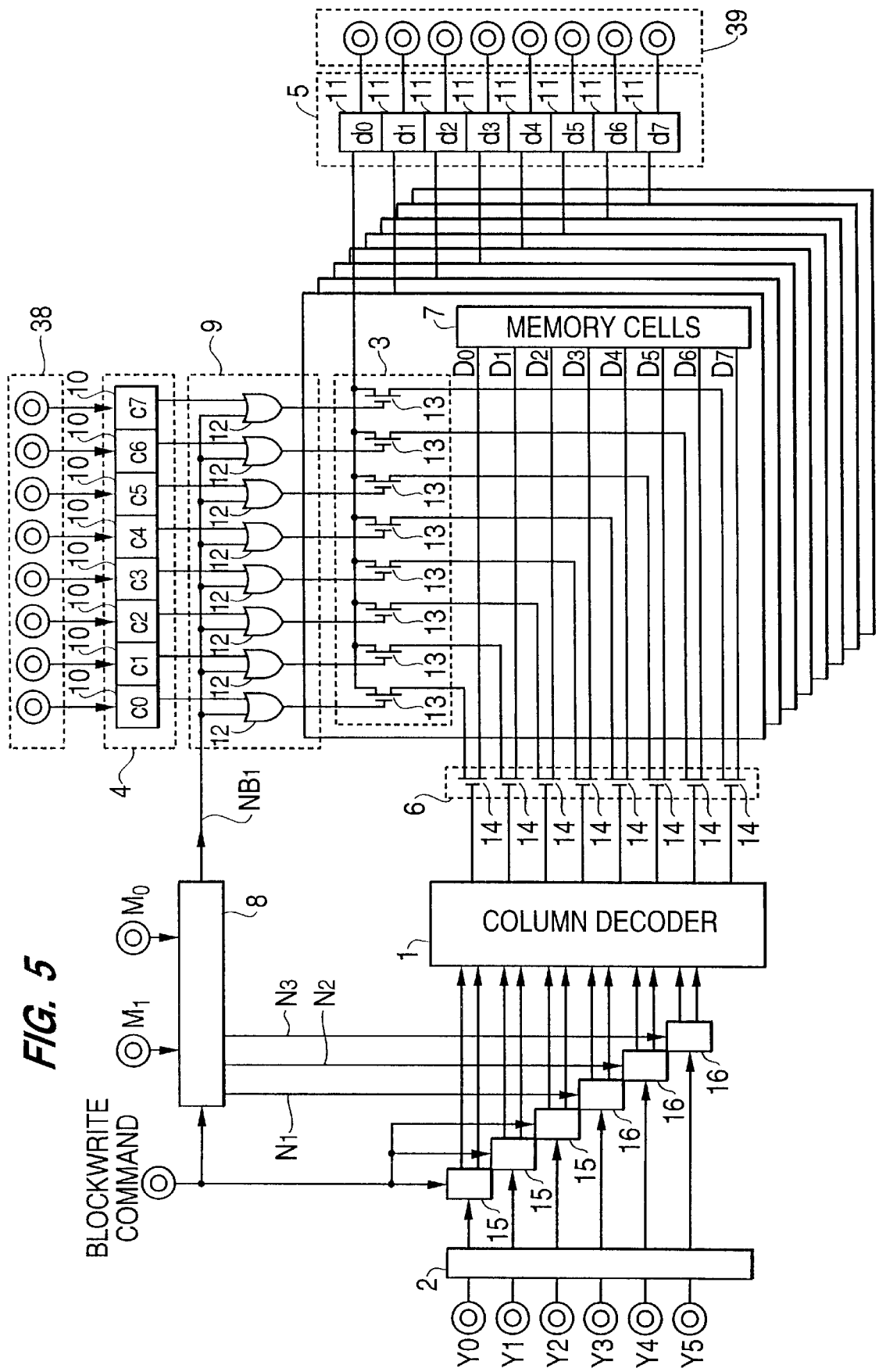
FIG. 5 is a block diagram showing an embodiment of a semiconductor memory device of the present invention.

FIG. 5 is a block diagrams showing an embodiment of a semiconductor memory device of the present invention. Like the conventional semiconductor memory device, in the semiconductor memory device of the embodiment having eight I/O terminals 38 and 39, one block to which data are simultaneously written contains eight columns. As shown in FIG. 5, the semiconductor memory device of the embodiment comprises, corresponding to the I/O terminals 38 and 39; a column decode circuit 1; a column address latch circuit 2; a write control circuit 3 including eight NMOS transistors 13; a column mask register 4 including eight registers 10; a color register 5 including eight registers 11; a Y switch 6 including eight switches 14; a memory cell 7; a block write control circuit 8; a column mask control circuit 9 including eight OR gates 12; a column address pre-decode circuits 15 corresponding to three subordinate column addresses; and a column address pre-decode circuits 16 corresponding to three superordinate column addresses. It should be noted that the circuit corresponding to one I/O terminal among the I/O terminals 39 is shown in FIG. 5, as the circuit including the write control circuit 3 and the memory cell 7. Moreover, constitution examples of the foregoing column address pre-decode circuit 16 and the foregoing block write control circuit 8 are illustrated in FIGS. 6 and 7.

Referring to FIG. 5, column addresses Y0, Y1, Y2, Y3, Y4 and Y5 supplied from the outside of the semiconductor memory device are supplied to the corresponding column address pre-decode circuits. The subordinate column addresses Y0, Y1 and Y2 are supplied to the corresponding column address pre-decode circuits 15 via the column address latching circuit 2 and the superordinate column addresses Y3, Y4 and Y5 are supplied to the corresponding column address pre-decode circuits 16. In the column address pre-decode circuits 15, like the conventional semiconductor memory devices, corresponding to the supply of the block write command signal ("H" level), the subordinate column addresses are ignored regardless of inputting of the subordinate column addresses. Concerning the signals YPOT and YPON supplied from the inverters 34 and 35, the eight columns (one block) are selected in which the superordinate column addresses Y3, Y4 and Y5 are the same. The "H" level signal is output and is supplied to the column decode circuit 1. Moreover, the column address pre-decode circuit 16, the constitution of which is illustrated in FIG. 6, consists of inverters 17, 20 and 21, and NOR gates 18 and 19. The column address pre-decode circuit 16 receives enable signals N1, N2 and N3 supplied from the block write control circuit 8. Upon receipt of the enable signals, the signals YSIN and YSIT are output and are supplied to the column decode circuit 1.

The block write control circuit 8, as shown in FIG. 7, consists of NOR gates 22, 25, 27, 28, 29 and 30, an NAND gate 24, and inverters 23 and 26. Upon receipt of mode signals M0 and M1 supplied from the outside of the semiconductor memory device, the block write control circuit 8 outputs the enable signals N1, N2 and N3 and a column mask release signal NB1 is output. The enable signals N1, N2 and N3 are transmitted to the three column address pre-decode circuits 16, respectively. The column mask release signal NB1 is supplied to the column mask control circuit 9. The number of the blocks, that is, the number of the columns, selected simultaneously in response to the mode signals M0 and M1 supplied to the block write control circuit 8, and output levels of the enable signals N1, N2 and N3 are illustrated in the Table of FIG. 8. Therefore, in the block write cycle, as shown in FIG. 7, in response to the supply of the block write command signal ("H" level), by combining the mode signals M0 and M1 supplied to the block write control circuit 8, block write cycles corresponding to eight blocks (64 columns) at maximum are selected, and writing operation can be performed. In the column mask used in the conventional block write, there has been the requirement that the number of the I/O terminals and the number of the columns of one block must be equal or the number of the selected columns must be smaller than the number of the I/O terminals. However, the present invention has a function to select simultaneously the several blocks, so that the number of the selected columns is larger sometimes than that of the I/O terminals. Therefore, when the number of the selected columns is larger than that of the I/O terminals, the semiconductor memory device of the present invention is constituted described below. Specifically, the column mask release signal NB1 output from the block write control circuit 8 shown in FIG. 7 is supplied to the column mask control circuit 9 including the OR gate 12, whereby data stored in the color register 5 is written to all of the selected columns without performing column mask. In other words, the semiconductor memory device of the present invention has a function to write simultaneously the same data to the columns of wide range, in addition to the block write function comprising the conventional column mask. Thus, the semiconductor memory device of the present invention can perform an image processing at higher speed than in the conventional block write.

Furthermore, the semiconductor memory device of this embodiment of the present invention is capable of using three bits of the subordinate column addresses which are not being used during the block write cycle, for the mode signals M1 and M0 supplied to the block write control circuit 8 shown in FIG. 7. Hence, it is not necessary to arrange new input terminals corresponding to the mode signals M1 and M0.

It should be noted that in the semiconductor memory device of the present invention, the input signals to the block write control circuit 8 are variable, the number of the blocks selected simultaneously is not limited to the one shown in this embodiment. Furthermore, the semiconductor memory device of the embodiment of the present invention is described using the example in which one block (eight columns) is simultaneously selected. The number of the columns per one block simultaneously selected is variable, so that the number of simultaneously selected columns is not limited to the one shown in the description of this embodiment.

Figure 9:
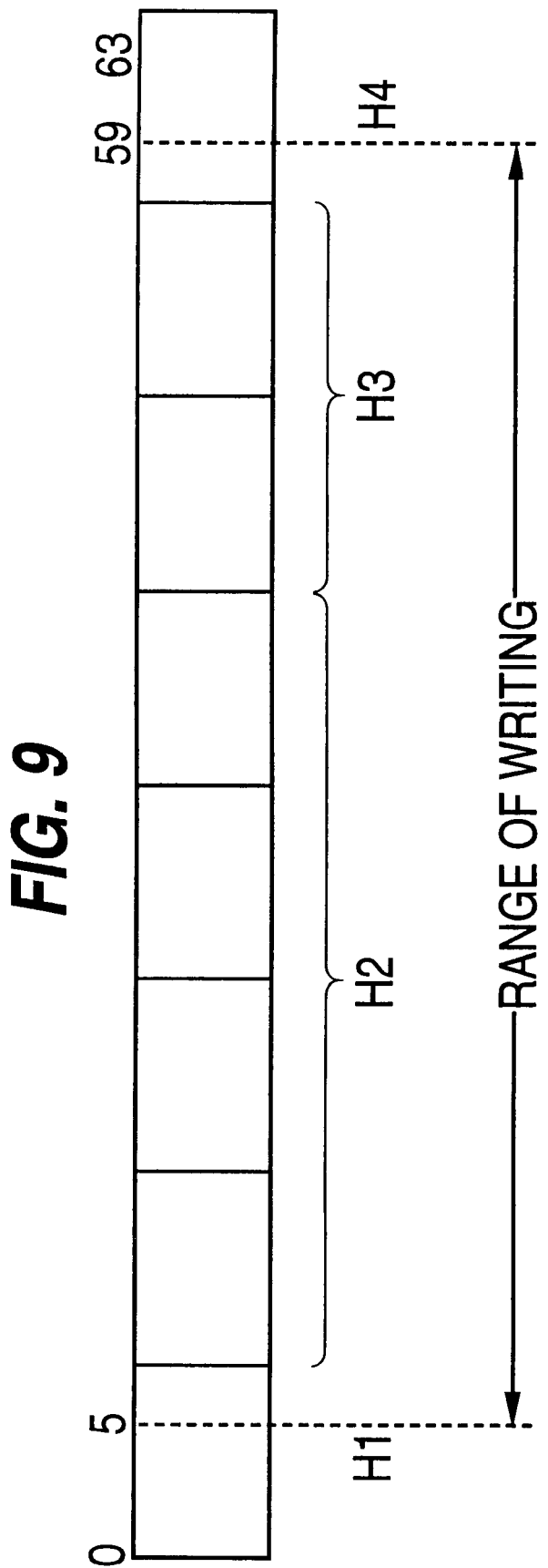
FIG. 9 is a schematic diagram showing a block write method in the embodiment of the semiconductor memory device of the present invention.

FIG. 9 is a schematic drawing showing an example of a block write method wherein one block contains eight blocks and 64 columns are divided into eight blocks in this embodiment. In the block write method shown in FIG. 9, data writing is performed for only addresses 5 to 59 among address 0 to 63. In FIG. 9, when data writing is performed for the addresses 5 to 59, data writing for the block at the portion H1 is performed by the block write using the column mask. Data writing is performed for the four blocks at the portions H2 by the block write in such manner that by supplying the mode signals M0 and M1 at levels "0" and "1", respectively, to the block write control circuit 8 shown in FIG. 7, the four blocks (32 columns) are simultaneously selected as shown in FIG. 8 to write data to the four blocks. Furthermore, data writing for the two blocks at the portion H3 is performed by the block write in such manner that by supplying the mode signals M0 and M1 at levels "1" and "0", respectively, to the block write circuit 8, the two blocks (16 columns) are simultaneously selected as shown in FIG. 8 to write the data to the two blocks. Then, finally, data writing for the one block is performed by the block write using the column mask. Thus, all of the data writing operations are finished.

Therefore, in the semiconductor memory device of the present invention, all of the data writing operations can be finished by performing the four cycles for the block write cycle to write the data to the memory device. As described above, it was required for the conventional block data write to perform eight cycles for the block write cycle. However, according to the semiconductor memory device of the present invention, it is possible to complete the data writing at the four cycles by selecting simultaneously the several blocks, whereby more high speed image processing can be realized.

It should be noted that the simultaneous selections of the digit lines D0 to D7 connected to the memory cell 7 and the write control operations for the memory cell 7 are the same as those of the foregoing conventional semiconductor memory device. Therefore, the descriptions for them are omitted.

As described above, according to the present invention, the number of the blocks, that is, the number of the columns, which are simultaneously selected to be written, is variable, and the number of the blocks, that is, the number of the columns can be freely selected, whereby the image processing for a specified region on the image plane can be performed over a wide range at a high speed.

What is claimed is:

1. A semiconductor memory device comprising:
   a plurality of first column address pre-decode means corresponding to subordinate column address inputs, controlled by a predetermined block write command signal at a block write cycle;
   a plurality of second column address pre-decode means corresponding to superordinate column address inputs and receiving specific enable signals at the block write cycle;
   column decode means for decoding outputs from said first and second column address pre-decode means and for outputting a decoded output;
   column mask data holding means for holding column mask data, said column mask data holding means being connected to a first I/O terminal group;
   color data holding means for holding color data, said color data holding means being connected to a second I/O terminal group;
   write control means controlled either by data supplied from said first I/O terminal group or said data held in said column mask data holding means, said write control means performing a write control for write inputs of either said data supplied from said second I/O terminal group or by said data held in said color data holding means;
   Y switch means, switchings of which are controlled by said decoded outputs from said column decode means, said Y switch means controlling connections of data output from said write control means to digit lines;
   block write control means for receiving one or more specific mode signals at the block write cycle and for generating said specific enable signals and outputting the enable signals to said second column address pre-decode means, said block write control means generating a specific column mask release signal;
   column mask control means controlled by said column mask release signal, said column mask control means controlling supplies of said column mask data to said write control means; and
   a plurality of memory cells corresponding to a plurality of columns as one block,
   wherein said memory device has a block write function to write prescribed data selectively and simultaneously to a memory cell corresponding to said one block, through a control operation by said enable signals and said column mask release signal output from said block write control means; and a control function to perform write/non-write control corresponding to individual column addresses in a block to which data is written simultaneously when the number of blocks is one, to which data is simultaneously written, and a control function to control compulsory simultaneous data writing corresponding to all blocks simultaneously designated when the number of the blocks is more than one, through a control operation by said enable signals and said column mask release signal output from said block write control means, wherein said column mask control means has a plurality of OR gates, each performing a logic-sum operation for write input data and said column mask release signal, and for outputting a result of the logic-sum operation, said write input data being obtained either from data supplied from said first I/O terminals or from data held in said column mask data holding means.

2. The semiconductor memory device according to claim 1, wherein said block write control means comprises:

first and second NOR gates, each gate performing a logic-sum operation for first and second mode signals of said specific mode signals and outputting a result of the logic-sum operation;

a first inverter inverting said second mode signal and outputting an inverted signal;

a NAND gate performing a logic-product operation for said first and second mode signals and outputting a result of the logic-product operation;

a second inverter inverting said block write command signal and outputting an inverted signal;

a third NOR gate performing a logic-sum operation for said result of the logic-sum operation and said inverted signal and outputting a result of the logic-sum operation;

a fourth NOR gate performing a logic-sum operation for said inverted signal from said first inverter and said inverted signal from said second inverter and outputting a result of the logic-sum operation;

a fifth NOR gate performing a logic-sum operation for said result of the logic-product operation from said NAND gate and said inverted signal from said second inverter and outputting a result of the logic-sum operation; and a sixth NOR gate performing a logic-sum operation for said result of the logic-sum operation from said second NOR gate and said inverted signal from said second inverter and outputting a result of the logic-sum operation, and wherein said semiconductor memory device has a function to receive said block write command signal and to output first, second and third enable signals as said enable signals and said column mask release signal in response to supplying of a mode signal including said first and second mode signals.

3. The semiconductor memory device according to claim 1, wherein said second column address pre-decode means comprises:

a first inverter receiving a superordinate column address and inverting said column address to output an inverted address;

a first NOR gate performing a logic-sum for said inverted address from said first inverter and an n-th enable signal (n=1, 2 and 3) to output a result of the logic-sum operation;

a second NOR gate performing a logic-sum operation for said superordinate column address and said n-th enable signal to output a result of the logic-sum operation;

a second inverter inverting an output level of said result of the logic-sum operation of said first NOR gate to output said inverted result of the logic-sum operation of said first NOR gate; and a third inverter inverting an output level of said result of the logic-sum operation of said second NOR gate to output said inverted result of the logic-sum operation of said second NOR gate.

4. The semiconductor memory device according to claim 1, wherein said column mask data holding means comprises a plurality of registers connected to said first I/O terminal group, said registers holding data supplied from said first I/O terminal group.

5. The semiconductor memory device according to claim 1, wherein said color data holding means comprises a plurality of registers connected to said second I/O terminal group, said registers holding data supplied from said second I/O terminal group.

6. The semiconductor memory device according to claim 1, wherein said first I/O terminal and said second I/O terminal are common I/O terminals.

* * * * *